US010591541B2

(12) United States Patent
Yamada (10) Patent No.: US 10,591,541 B2
(45) Date of Patent: Mar. 17, 2020

(54) COMPARATOR

(71) Applicant: MICRON TECHNOLOGY, INC., Boise, ID (US)

(72) Inventor: Shigekazu Yamada, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/101,563

(22) Filed: Aug. 13, 2018

(65) Prior Publication Data

US 2020/0049763 A1 Feb. 13, 2020

(51) Int. Cl.
*G01R 31/3177* (2006.01)
*G01R 31/317* (2006.01)
*G11C 29/38* (2006.01)

(52) U.S. Cl.
CPC ... *G01R 31/3177* (2013.01); *G01R 31/31703* (2013.01); *G01R 31/31706* (2013.01); *G01R 31/31723* (2013.01); *G01R 31/31725* (2013.01); *G11C 29/38* (2013.01)

(58) Field of Classification Search
CPC .......... G01R 31/3177; G01R 31/31703; G01R 31/31706; G01R 31/31723; G01R 31/31725; G11C 29/38
See application file for complete search history.

(56) References Cited

U.S. PATENT DOCUMENTS

| | | | | |
|---|---|---|---|---|
| 5,933,459 A | * | 8/1999 | Saunders | H04L 25/061 327/52 |
| 2003/0043926 A1 | * | 3/2003 | Terashima | H04L 7/0012 375/257 |
| 2006/0223201 A1 | * | 10/2006 | Liu | G01R 31/2642 438/10 |
| 2007/0300114 A1 | * | 12/2007 | Doi | G01R 31/31917 714/735 |
| 2015/0113344 A1 | * | 4/2015 | Morton | G01R 31/318558 714/727 |

(Continued)

OTHER PUBLICATIONS

Saloni et al., "Comparator-multiplexer based 6 bit 1.4GSPS low power ADC", 2013 8th International Conference on Design & Technology of Integrated Systems in Nanoscale Era (DTIS), Date of Conference: Mar. 26-28, 2013, pp. 134-139. (Year: 2013).*

*Primary Examiner* — Kyle Vallecillo
(74) *Attorney, Agent, or Firm* — Dicke, Billig & Czaja, PLLC (57) ABSTRACT

A device includes a comparator, a reference signal node electrically coupled to a first input of the comparator, a plurality of test signal nodes, a plurality of first select signal nodes, a first multiplexer coupled between the plurality of test signal nodes and the comparator, a plurality of latches, a plurality of second select signal nodes, and a second multiplexer. Each first select signal node corresponds to a test signal node. The first multiplexer electrically couples one of the plurality of test signal nodes to a second input of the comparator in response to a corresponding first select signal. Each latch corresponds to a test signal node. Each second select signal node corresponds to a latch. The second multiplexer electrically couples the output of the comparator to an input of one of the plurality of latches in response to a corresponding second select signal.

16 Claims, 11 Drawing Sheets

(56) References Cited

U.S. PATENT DOCUMENTS

| | | | |
|---|---|---|---|
| 2016/0124043 A1* | 5/2016 | Datta | G01R 31/31725 |
| | | | 714/731 |
| 2017/0047913 A1* | 2/2017 | Roy | G11C 11/54 |
| 2017/0110204 A1* | 4/2017 | Kothiala | G11C 29/38 |
| 2017/0227602 A1* | 8/2017 | Clerc | G01R 31/3177 |
| 2018/0321308 A1* | 11/2018 | Clerc | G01R 31/31727 |
| 2019/0096776 A1* | 3/2019 | Nishioka | H01L 23/481 |

* cited by examiner

| $270_0$ | $270_1$ | $270_2$ | $270_3$ |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

COMPARATOR

TECHNICAL FIELD

The present disclosure relates generally to comparators in integrated circuit devices. In particular, in one or more embodiments, the present disclosure relates to comparators for testing multiple signals in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

A comparator may be used to compare a test signal to a reference signal in an integrated circuit, such as a memory device. An integrated circuit may include multiple comparators to compare multiple test signals to a reference signal or to multiple reference signals. Multiple comparators within an integrated circuit, however, may result in a large constant current draw and may also occupy a significant amount of space within the integrated circuit. The constant current draw and the area occupied by the comparators in an integrated circuit should be minimized to improve efficiency and lower cost.

For the reasons stated above, and for other reasons stated below which will become apparent to those skilled in the art upon reading and understanding the present specification, there is a need in the art for alternative methods for comparing multiple test signals to a reference signal, and system and apparatus to perform such methods.

DETAILED DESCRIPTION

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Multiple comparators may be used to compare test signals to reference signals within an integrated circuit, such as a memory device. Each comparator draws a constant DC current and occupies space in the integrated circuit. Accordingly, this disclosure describes embodiments for reducing DC current draw and the area occupied due to multiple comparators within an integrated circuit.

Figure 1:
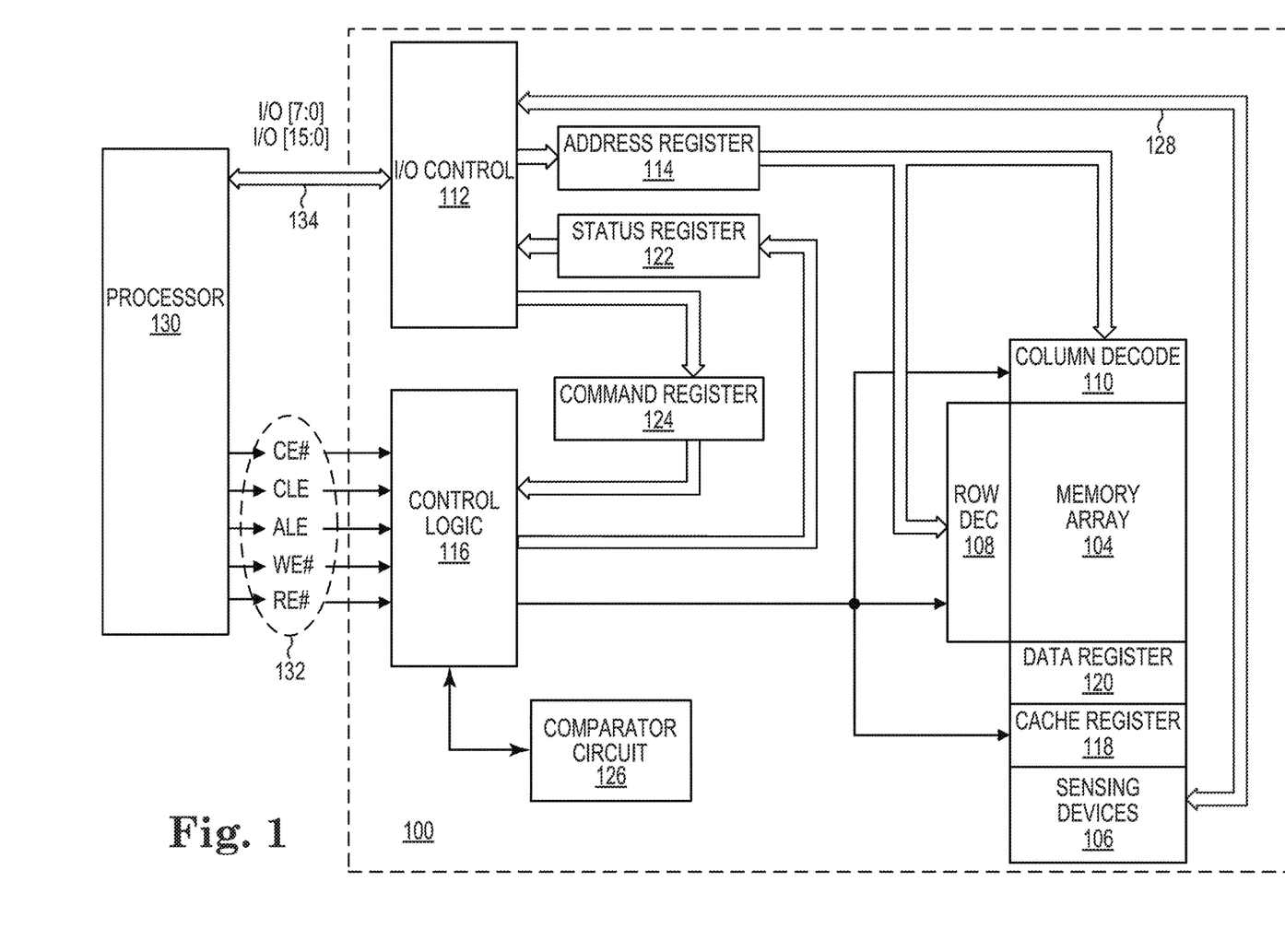
FIG. 1 is a simplified block diagram of one embodiment of a memory device in communication with a processor as part of an electronic system.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes a comparator circuit 126. Comparator circuit 126 may serially compare each test signal of a plurality of test signals to a single reference signal or to each reference signal of a plurality of reference signals. By using a single comparator to serially compare each test signal to a reference signal or to each reference signal of a plurality of reference signals, the DC current draw of memory device 100 is reduced and the area occupied by comparators within memory device 100 is reduced compared to a memory device including a comparator to compare each test signal to each reference signal.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses. Control logic 116 is also in communication with comparator circuit 126 to initiate the comparison of test signals to reference signals and to receive pass/fail results based on the comparisons.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
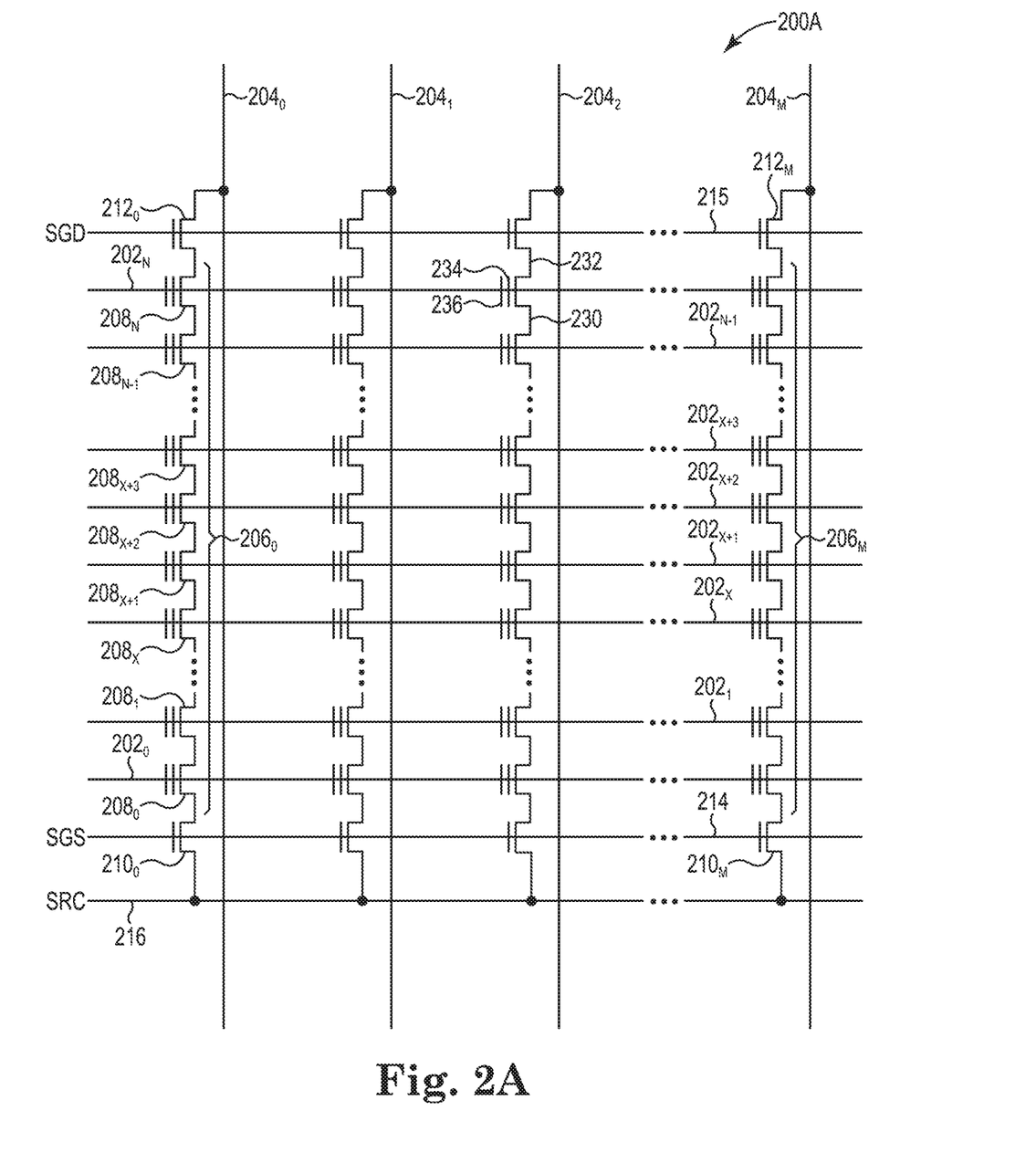
FIGS. 2A-2D are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
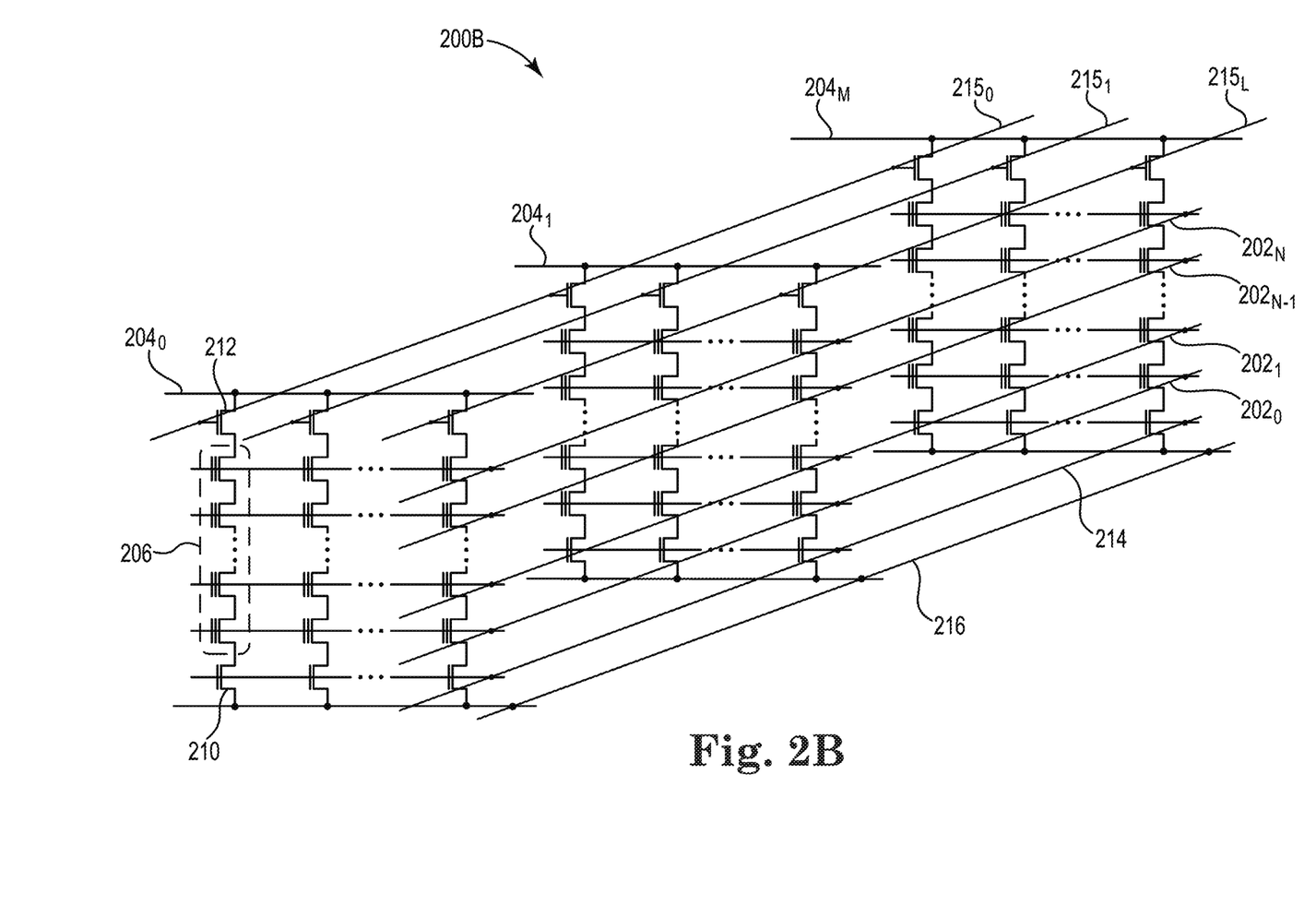

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
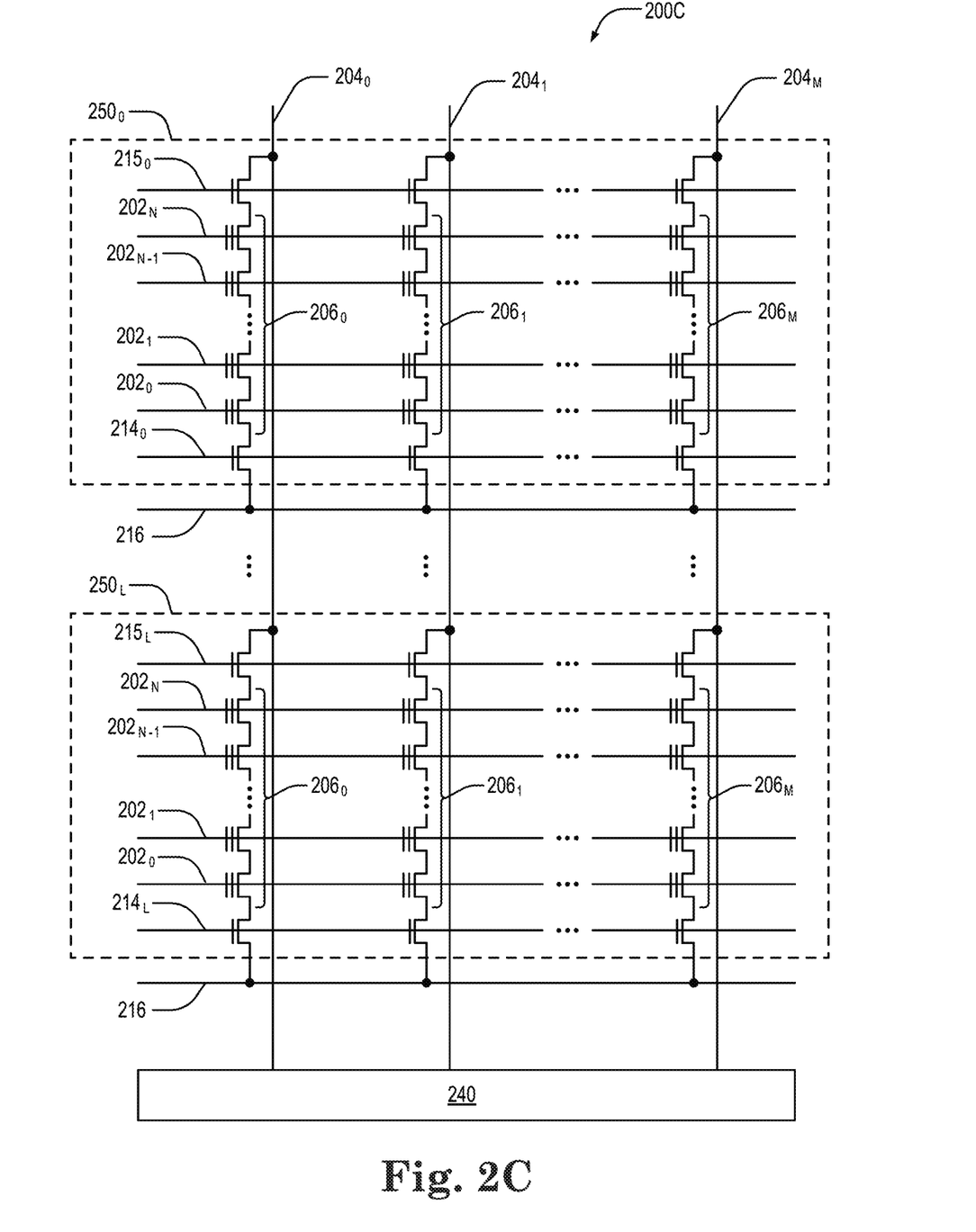

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells 250.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown) for sensing data values indicated on respective data lines 204, and corresponding registers (not shown) for storage of the sensed data values from its corresponding memory plane.

Figure 2D:
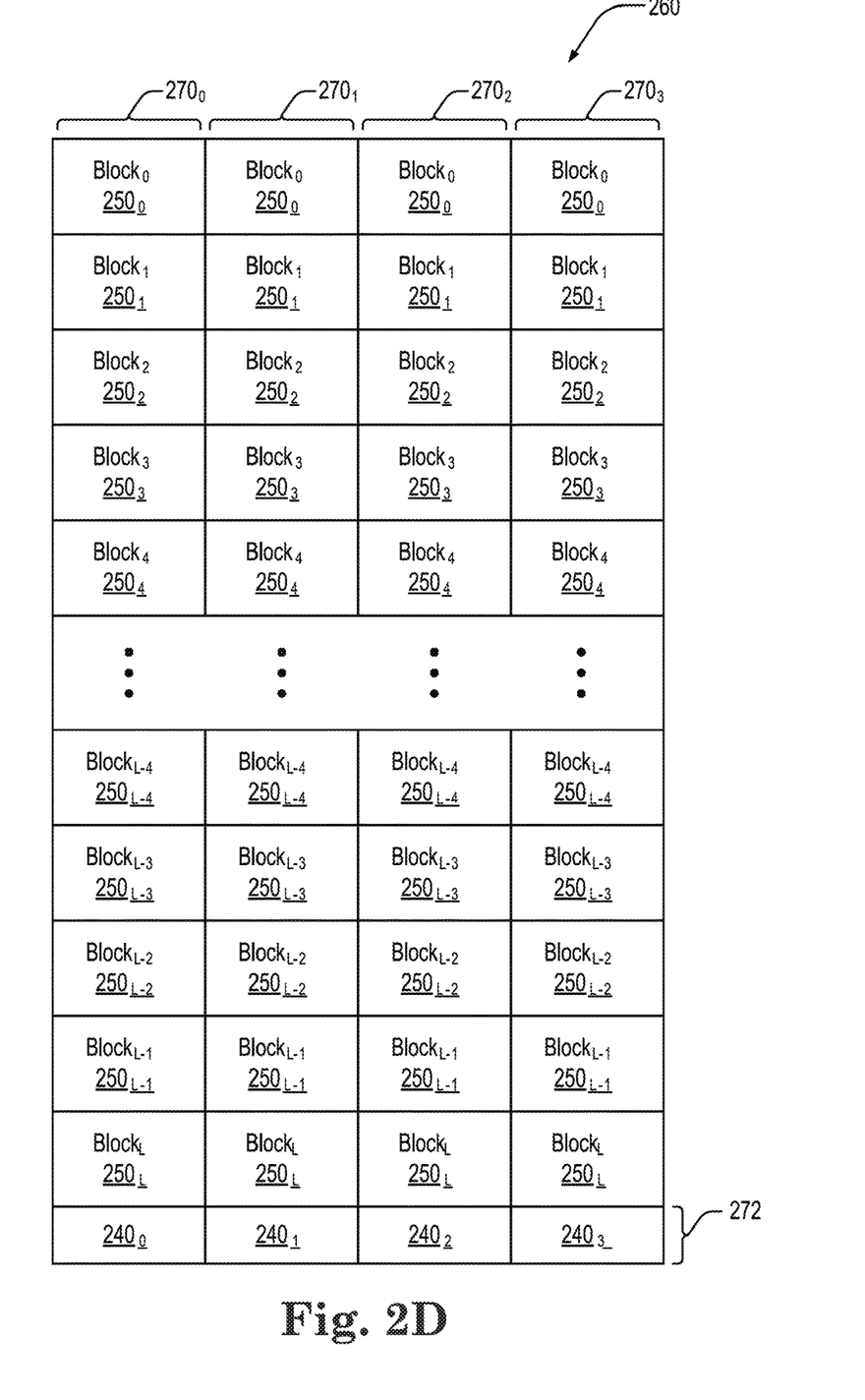

FIG. 2D is a block schematic of a portion of an array of memory cells as could be used in a memory of the type described with reference to FIG. 1. The array of memory cells 260 is depicted to have four memory planes 270 (e.g., memory planes $270_0$-$270_3$), each in communication with a respective buffer portion 240, which might collectively form a page buffer 272. While four memory planes 270 are depicted, other numbers of memory planes 270 might be commonly in communication with a page buffer 272. Each memory plane 270 is depicted to include L+1 blocks of memory cells 250 (e.g., blocks of memory cells $250_0$-$250_L$).

Although the examples of FIGS. 2A-2D are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
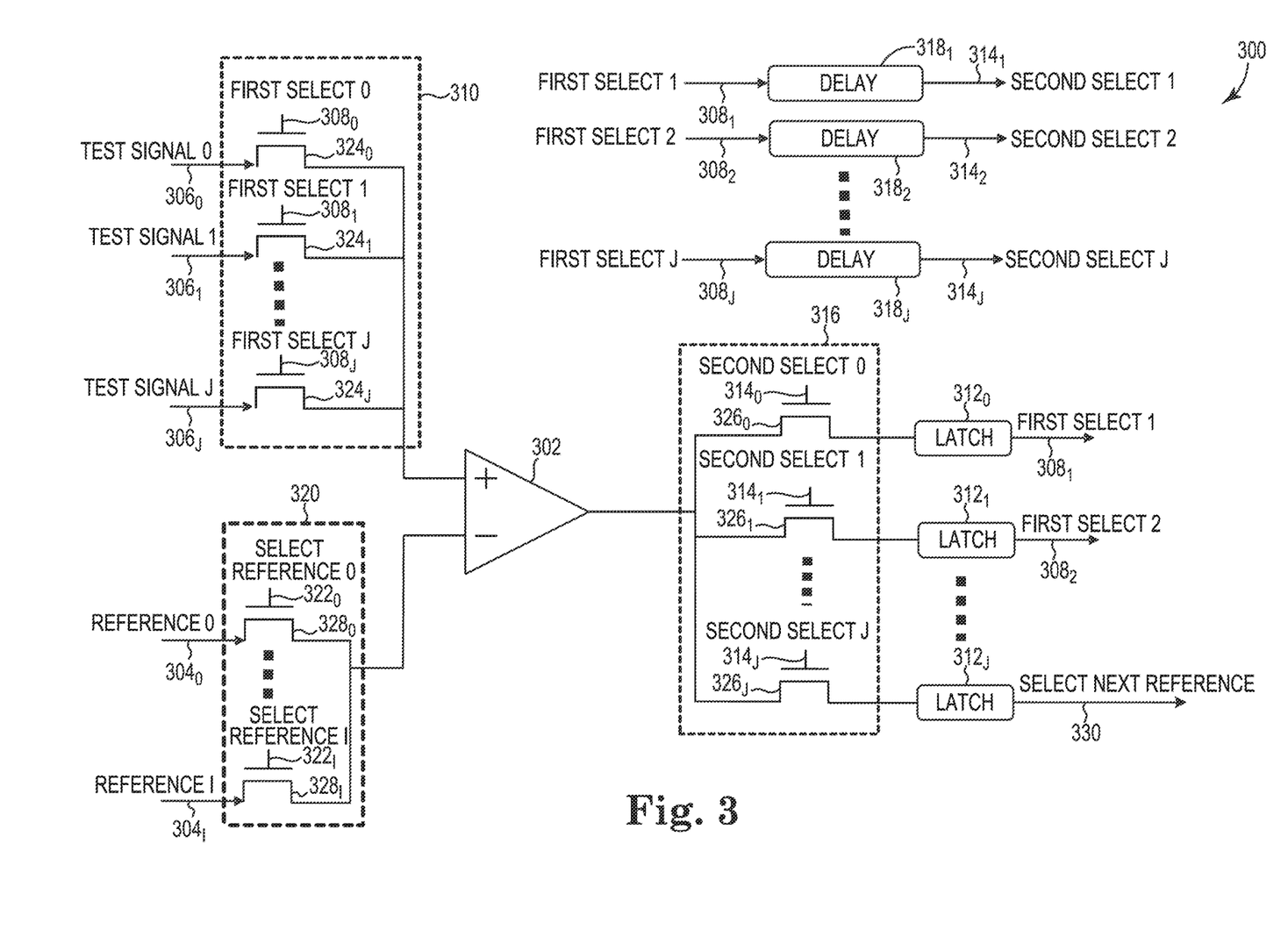
FIG. 3 is a schematic diagram illustrating one embodiment of a comparator circuit.

FIG. 3 is a schematic diagram illustrating one embodiment of a comparator circuit 300. In one embodiment, comparator circuit 300 may provide comparator circuit 126 of memory device 100 previously described and illustrated with reference to FIG. 1. Comparator circuit 300 may include a comparator 302, a plurality of reference signal nodes $304_0$ to $304_I$, a plurality of test signal nodes $306_0$ to $306_J$, and a plurality of first select signal nodes $308_0$ to $308_J$. In one embodiment, each test signal node $306_0$ to $306_J$ may include a data line signal node of a memory plane. In another embodiment, each test signal node $306_0$ to $306_J$ may include an access line signal node of a memory plane. In yet other embodiments, each test signal node $306_0$ to $306_J$ may include other signal nodes to be tested within memory 100.

In one embodiment, comparator 302 may be a differential comparator. A first input (e.g., the inverting input) of the comparator 302 may be electrically coupled to a reference signal node. Each first select signal node $308_0$ to $308_J$ may correspond to a test signal node $306_0$ to $306_J$, respectively. Comparator circuit 300 may also include a first multiplexer 310 coupled between the plurality of test signal nodes $306_0$ to $306_J$ and the comparator 302. The first multiplexer 310 electrically couples one of the plurality of test signal nodes $306_0$ to $306_J$ to a second input (e.g., the non-inverting input) of the comparator 302 via a transistor switch $324_0$ to $324_J$ in response to a corresponding first select signal on one of the plurality of first select signal nodes $308_0$ to $308_J$.

Comparator circuit 300 may also include a plurality of latches $312_0$ to $312_J$ and a plurality of second select signal nodes $314_0$ to $314_J$. Each latch $312_0$ to $312_J$ may correspond to a test signal node $306_0$ to $306_J$, respectively. Each second select signal node $314_0$ to $314_J$ may correspond to a latch $312_0$ to $312_J$, respectively. Comparator circuit 300 may also include a second multiplexer 316 coupled between the output of the comparator 302 and the plurality of latches $312_0$ to $312_J$. The second multiplexer 316 electrically couples the output of the comparator 302 to an input of one of the plurality of latches $312_0$ to $312_J$ via a transistor switch $326_0$ to $326_J$ in response to a corresponding second select signal on one of the plurality of second select signal nodes $314_0$ to $314_J$.

Comparator circuit 300 may also include a plurality of delays $318_1$ to $318_J$. The input of each delay $318_1$ to $318_J$ is electrically coupled to a corresponding first select signal node $308_1$ to $308_J$, and the output of each delay $318_1$ to $318_J$ is electrically coupled to a corresponding second select signal node $314_1$ to $314_J$, respectively. Each delay $318_1$ to $318_J$ may include a resistive-capacitive (RC) delay. Each delay $318_1$ to $318_J$ provides a settling time for comparator 302 to stabilize after switching the input to the comparator 302 prior to latching the comparison result output from comparator 302. In one embodiment, each delay $318_1$ to $318_J$ delays each first select signal on first select signal nodes $308_1$ to $308_J$ by about 10 ns or less to provide each second select signal on second select signal nodes $314_1$ to $314_J$, respectively.

Comparator circuit 300 may also include a third multiplexer 320. The third multiplexer 320 is coupled between the plurality of reference signal nodes $304_0$ to $304_I$ and the first input (e.g., inverting input) of the comparator 302. The third multiplexer 320 electrically couples one of the plurality of reference signal nodes $304_0$ to $304_I$ to the first input of the comparator 302 via a transistor switch $328_0$ to $328_I$ in response to a corresponding select reference signal on a select reference signal node $322_0$ to $322_I$. In other embodiments, third multiplexer 320 may be excluded and a single reference signal may be input directly to the first input of the comparator 302.

In operation where third multiplexer 320 is excluded and a single reference signal is used, control logic, such as control logic 116 of FIG. 1, may initiate a comparison of each test signal to the reference signal by setting an initial first select signal (i.e., first select 0 signal) on first select 0 signal node $308_0$ logic high and an initial second select signal (i.e., second select 0 signal) on second select 0 signal node $314_0$ logic high. Since this is the initial comparison performed by comparator 302, a delay (i.e., $318_1$ to $318_J$) to delay the first select 0 signal to provide the second select 0 signal is not needed. In operation where third multiplexer 320 is not excluded and multiple reference signals are used, the control logic may initiate a comparison of each test signal to each reference signal by setting the initial first select signal logic high, the initial second select signal logic high, and an initial select reference signal (i.e., select reference 0 signal) on select reference 0 signal node $322_0$ logic high.

With the first select 0 signal logic high, first multiplexer 310 passes test signal 0 on test signal 0 node $306_0$ to the second input of comparator 302 via transistor switch $324_0$. With the select reference 0 signal logic high, third multiplexer 320 passes the reference 0 signal on reference 0 signal node $304_0$ to the first input of comparator 302 via transistor switch $328_0$. In response to the voltage of test signal 0 being greater than the voltage of the reference 0 signal, comparator 302 outputs a logic high signal. In response to the voltage of test signal 0 being less than the voltage of the reference 0 signal, comparator 302 outputs a logic low signal. With the second select 0 signal logic high, second multiplexer 316 passes the output of comparator 302 to latch $312_0$ via transistor switch $326_0$. Latch $312_0$ then latches the comparison result for test signal 0. In response to latching the comparison result for test signal 0, latch $312_0$ sets the first select 1 signal on first select 1 signal node $308_1$ logic high, sets the first select 0 signal on first select 0 signal node $308_0$ logic low, and sets the second select 0 signal on second select 0 signal node $314_0$ logic low. The first select 1 signal on first select 1 signal node $308_1$ is delayed by delay $318_1$ to provide a logic high second select 1 signal on second select 1 signal node $314_1$.

With the first select 1 signal logic high, first multiplexer 310 passes test signal 1 on test signal 1 node $306_1$ to the second input of comparator 302 via transistor switch $324_1$ and the process repeats for each test signal to sequentially latch the comparison result for each test signal in latches $312_1$ to $312_J$. The comparison results latched within each latch $312_0$ to $312_J$ may be passed to another circuit (e.g., control logic 116 of FIG. 1) and used to determine if all test signals 0-J pass the comparison test to the reference 0 signal. In one embodiment, all test signals 0-J pass the comparison test if the voltage of each test signal 0-J is less than the voltage of the reference 0 signal. In another embodiment, all test signals 0-J pass the comparison test if the voltage of each test signal 0-J is greater than the voltage of the reference 0 signal.

In response to latching the comparison result in latch $312_J$ for test signal J, latch $312_J$ sets the select next reference signal on select next reference signal node 330 logic high, which selects the next reference signal (i.e., reference 1) to be passed by the third multiplexer 320 to comparator 302. The select next reference signal may also initiate the reset of latches $312_0$ to $312_J$ so that each latch $312_0$ to $312_J$ is ready to accept the next comparison result for each test signal 0-J. Each test signal 0-J is then compared to the reference 1 signal and each comparison result is latched in latches $312_0$ to $312_J$, respectively. The comparison results latched within each latch $312_0$ to $312_J$ may be passed to the other circuit (e.g., control logic 116 of FIG. 1) and used to determine if all test signals 0-J pass the comparison test to the reference 1 signal. The process then repeats to test each test signal 0-J to each reference signal up to the reference I signal on reference I signal node $304_I$.

Figure 4:
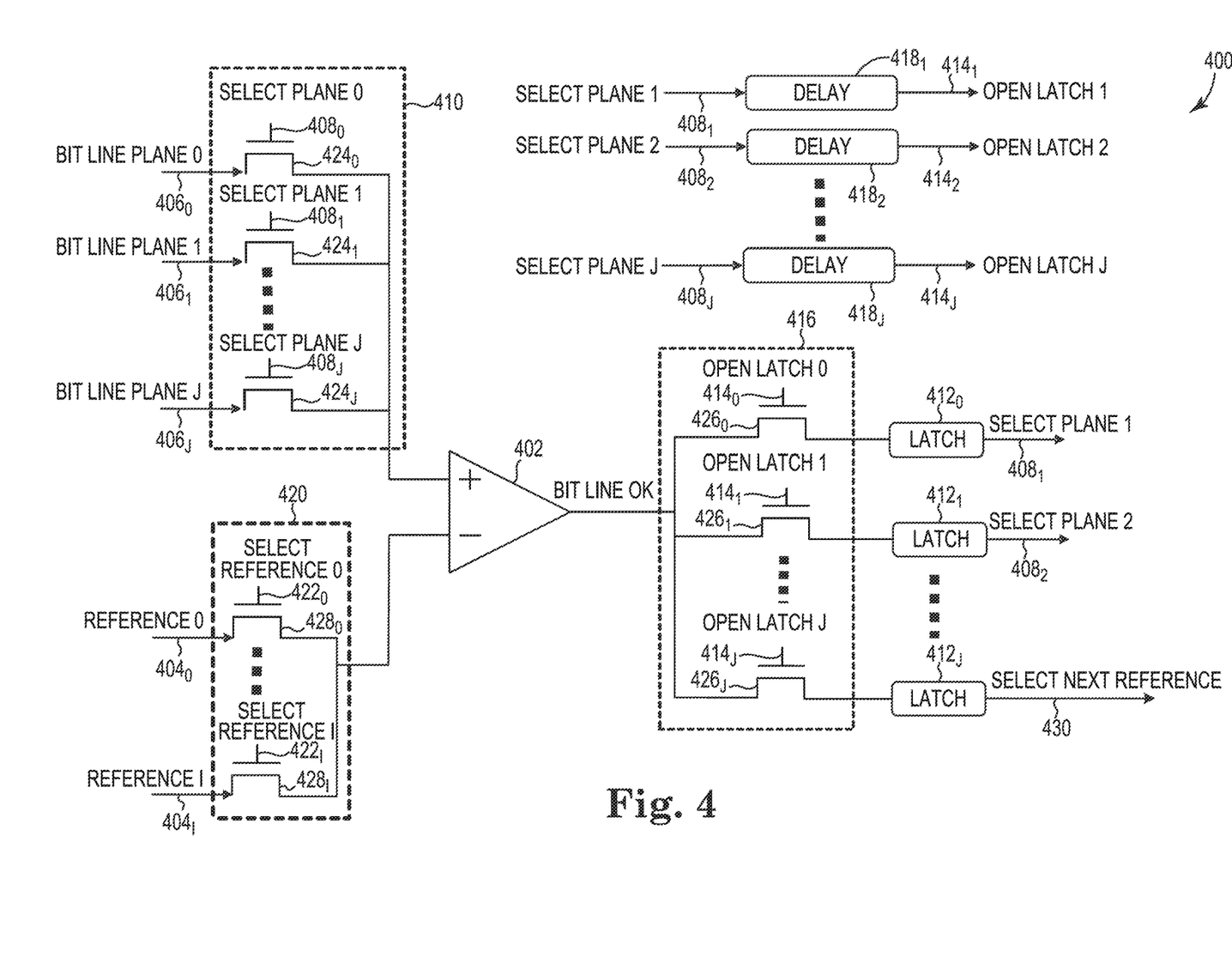
FIG. 4 is a schematic diagram illustrating another embodiment of a comparator circuit.

FIG. 4 is a schematic diagram illustrating another embodiment of a comparator circuit 400. In one embodiment, comparator circuit 400 may provide comparator circuit 126 of memory device 100 previously described and illustrated with reference to FIG. 1. Comparator circuit 400 may include a comparator 402, a plurality of reference signal nodes $404_0$ to $404_I$, a plurality of bit line (i.e., data line) nodes $406_0$ to $406_J$ corresponding to a plurality of memory planes 0-J, and a plurality of select plane signal nodes $408_0$ to $408_J$.

In one embodiment, comparator 402 may be a differential comparator. A first input (e.g., the inverting input) of the comparator 402 may be electrically coupled to a reference signal node. Each select plane signal node $408_0$ to $408_J$ may correspond to a bit line node $406_0$ to $406_J$, respectively. Comparator circuit 400 may also include a first multiplexer 410 coupled between the plurality of bit line nodes $406_0$ to $406_J$ and the comparator 402. The first multiplexer 410 electrically couples one of the plurality of bit line nodes $406_0$ to $406_J$ to a second input (e.g., the non-inverting input) of the comparator 402 via a transistor switch $424_0$ to $424_J$ in response to a corresponding select plane signal on one of the plurality of select plane signal nodes $408_0$ to $408_J$.

Comparator circuit 400 may also include a plurality of latches $412_0$ to $412_J$ and a plurality of open latch signal nodes $414_0$ to $414_J$. Each latch $412_0$ to $412_J$ may correspond to a bit line node $406_0$ to $406_J$ of a memory plane 0-J, respectively. Each open latch signal node $414_0$ to $414_J$ may correspond to a latch $412_0$ to $412_J$, respectively. Comparator circuit 400 may also include a second multiplexer 416 coupled between the output of the comparator 402 and the plurality of latches $412_0$ to $412_J$. The second multiplexer 416 electrically couples the output of the comparator 402 to an input of one of the plurality of latches $412_0$ to $412_J$ via a transistor switch $426_0$ to $426_J$ in response to a corresponding open latch signal on one of the plurality of open latch signal nodes $414_0$ to $414_J$.

Comparator circuit 400 may also include a plurality of delays $418_1$ to $418_J$. The input of each delay $418_1$ to $418_J$ is electrically coupled to a corresponding select plane signal node $408_1$ to $408_J$, and the output of each delay $418_1$ to $418_J$ is electrically coupled to a corresponding open latch signal node $414_1$ to $414_J$, respectively. Each delay $418_1$ to $418_J$ may include a resistive-capacitive (RC) delay. Each delay $418_1$ to $418_J$ provides a settling time for comparator 402 to stabilize after switching the input to the comparator 402 prior to latching the output from comparator 402. In one embodiment, each delay $418_1$ to $418_J$ delays each select plane signal on select plane signal nodes $408_1$ to $408_J$ by about 10 ns or less to provide each open latch signal on open latch signal nodes $414_1$ to $414_J$, respectively.

Comparator circuit 400 may also include a third multiplexer 420. The third multiplexer 420 is coupled between the plurality of reference signal nodes $404_0$ to $404_I$ and the first input (e.g., inverting input) of the comparator 402. The third multiplexer 420 electrically couples one of the plurality of reference signal nodes $404_0$ to $404_I$ to the first input of the comparator 402 via a transistor switch $428_0$ to $428_I$ in response to a corresponding select reference signal on a select reference signal node $422_0$ to $422_I$. In other embodiments, third multiplexer 420 may be excluded and a single reference signal may be input directly to the first input of the comparator 402.

In operation where third multiplexer 420 is excluded and a single reference signal is used, control logic, such as control logic 116 of FIG. 1, may initiate a comparison of each bit line signal for planes 0-J to the reference signal by setting an initial select plane signal (i.e., select plane 0 signal) on select plane 0 signal node $408_0$ logic high and an initial open latch signal (i.e., open latch 0 signal) on open latch 0 signal node $414_0$ logic high. Since this is the initial comparison performed by comparator 402, a delay (i.e., $418_1$ to $418_J$) to delay the select plane 0 signal to provide the open latch 0 signal is not needed. In operation where third multiplexer 420 is not excluded and multiple reference signals are used, the control logic may initiate a comparison of each bit line signal for planes 0-J to each reference signal by setting the initial select plane signal logic high, the initial open latch signal logic high, and an initial select reference signal (i.e., select reference 0 signal) on select reference 0 signal node $422_0$ logic high.

With the select plane 0 signal logic high, first multiplexer 410 passes the bit line plane 0 signal on bit line node $406_0$ to the second input of comparator 402 via transistor switch $424_0$. With the select reference 0 signal logic high, third multiplexer 420 passes the reference 0 signal on reference 0 signal node $404_0$ to the first input of comparator 402 via transistor switch $428_0$. In response to the voltage of the bit line plane 0 signal being greater than the voltage of the reference 0 signal, comparator 402 outputs a logic high bit line OK signal. In response to the voltage of the bit line plane 0 signal being less than the voltage of the reference 0 signal, comparator 402 outputs a logic low bit line OK signal. With the open latch 0 signal logic high, second multiplexer 416 passes the bit line OK signal output from comparator 402 to latch $412_0$ via transistor switch $426_0$. Latch $412_0$ then latches the bit line OK signal for bit line plane 0. In response to latching the bit line OK signal for bit line plane 0, latch $412_0$ sets the select plane 1 signal on select plane 1 signal node $408_1$ logic high, sets the select plane 0 signal on select plane 0 signal node $408_0$ logic low, and sets the open latch 0 signal on open latch 0 signal node $414_0$ logic low. The select plane 1 signal on select plane 1 signal node $408_1$ is delayed by RC delay $418_1$ to provide a logic high open latch 1 signal on open latch 1 signal node $414_1$.

With the select plane 1 signal logic high, first multiplexer 410 passes the bit line plane 1 signal on bit line node $406_1$ to the second input of comparator 402 via transistor switch $424_1$ and the process repeats for each bit line signal to sequentially latch the bit line OK signal for each bit line signal in latches $412_1$ to $412_J$. The bit line OK signal latched within each latch $412_0$ to $412_J$ may be passed to another circuit (e.g., control logic 116 of FIG. 1) and used to determine if all bit line signals 0-J pass the comparison test to the reference 0 signal. If all bit line signals 0-J pass the comparison test, the next step in the memory operation may proceed. In one embodiment, all bit line signals 0-J pass the comparison test if the voltage of each bit line signal 0-J is less than the voltage of the reference 0 signal. In another embodiment, all bit line signals 0-J pass the comparison test if the voltage of each bit line signal 0-J is greater than the voltage of the reference 0 signal.

In response to latching the bit line OK signal in latch $412_J$ for the bit line plane J signal, latch $412_J$ sets the select next reference signal on select next reference signal node 430 logic high, which selects the next reference signal (i.e., reference 1) to be passed by the third multiplexer 420 to comparator 402. The select next reference signal may also initiate the reset of latches $412_0$ to $412_J$ so that each latch $412_0$ to $412_J$ is ready to accept the next bit line OK signal for each bit line signal 0-J. Each bit line signal 0-J is then compared to the reference 1 signal and each bit line OK signal is latched in latches $412_0$ to $412_J$, respectively. The bit line OK signal latched within each latch $412_0$ to $412_J$ may be passed to the other circuit (e.g., control logic 116 of FIG. 1) and used to determine if all bit line signals 0-J pass the comparison test to the reference 1 signal. The process then repeats to test each bit line signal 0-J to each reference signal up to the reference I signal on reference I signal node $404_I$.

Figure 5A:
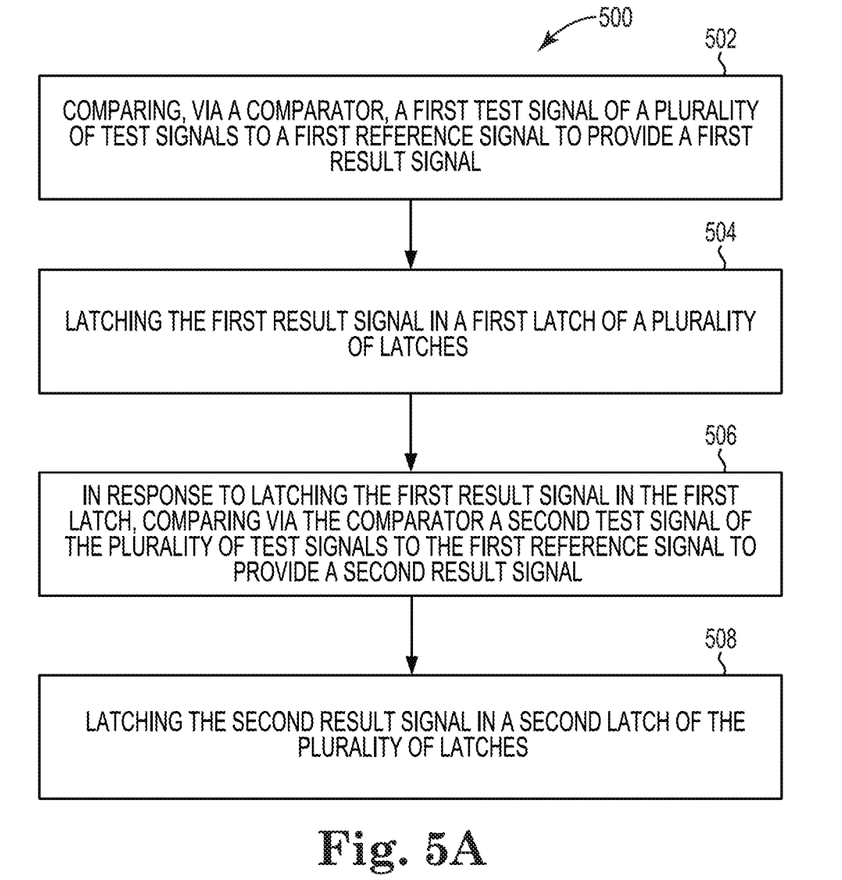
FIGS. 5A-5D are flow diagrams illustrating one embodiment of a method for comparing test signals to a reference signal.

FIGS. 5A-5D are flow diagrams illustrating one embodiment of a method 500 for comparing test signals to a reference signal. In one embodiment, method 500 may be implemented by the comparator circuit 300 previously described and illustrated with reference to FIG. 3. As illustrated in FIG. 5A, at 502 method 500 includes comparing, via a comparator, a first test signal of a plurality of test signals to a first reference signal to provide a first result signal. At 504, method 500 includes latching the first result signal in a first latch of a plurality of latches. At 506, method 500 includes in response to latching the first result signal in the first latch, comparing via the comparator a second test signal of the plurality of test signals to the first reference signal to provide a second result signal. At 508, method 500 includes latching the second result signal in a second latch of the plurality of latches.

Figure 5B:
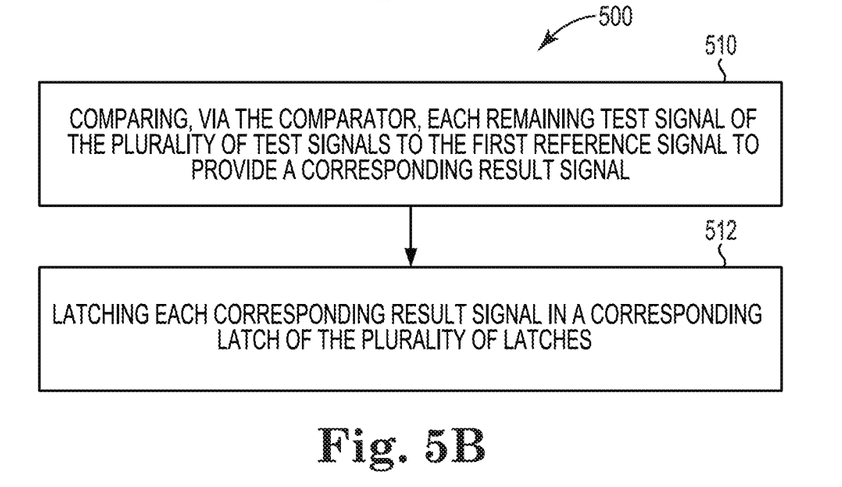
Figure 5C:
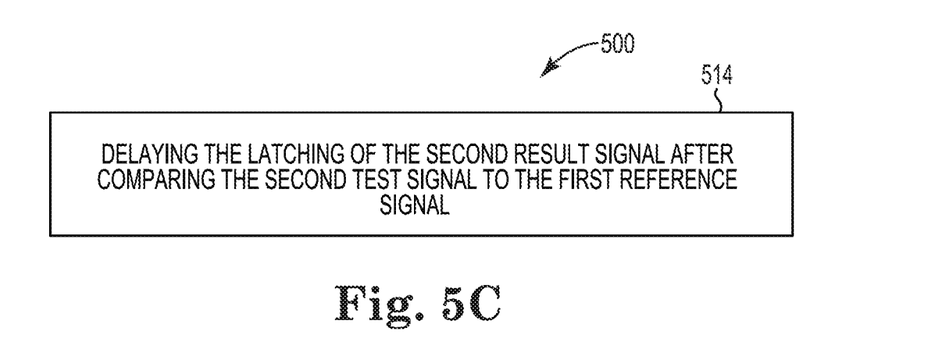

As illustrated in FIG. 5B, at 510 method 500 may further include comparing, via the comparator, each remaining test signal of the plurality of test signals to the first reference signal to provide a corresponding result signal. At 512, method 500 may further include latching each corresponding result signal in a corresponding latch of the plurality of latches. As illustrated in FIG. 5C, at 514 method 500 may further include delaying the latching of the second result signal after comparing the second test signal to the first reference signal.

Figure 5D:
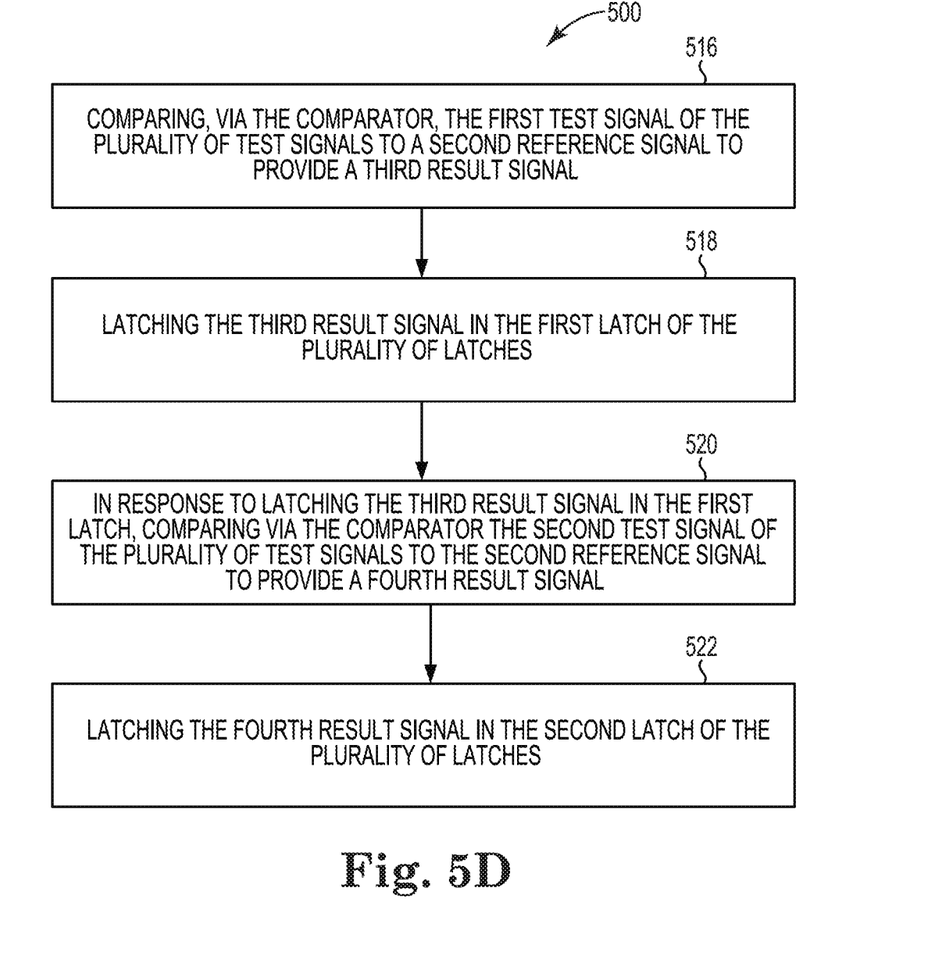

As illustrated in FIG. 5D, at 516 method 500 may further include comparing, via the comparator, the first test signal of the plurality of test signals to a second reference signal to provide a third result signal. At 518, method 500 may further include latching the third result signal in the first latch of the plurality of latches. At 520, method 500 may further include in response to latching the third result signal in the first latch, comparing via the comparator the second test signal of the plurality of test signals to the second reference signal to provide a fourth result signal. At 522, method 500 may further include latching the fourth result signal in the second latch of the plurality of latches.

Figure 6A:
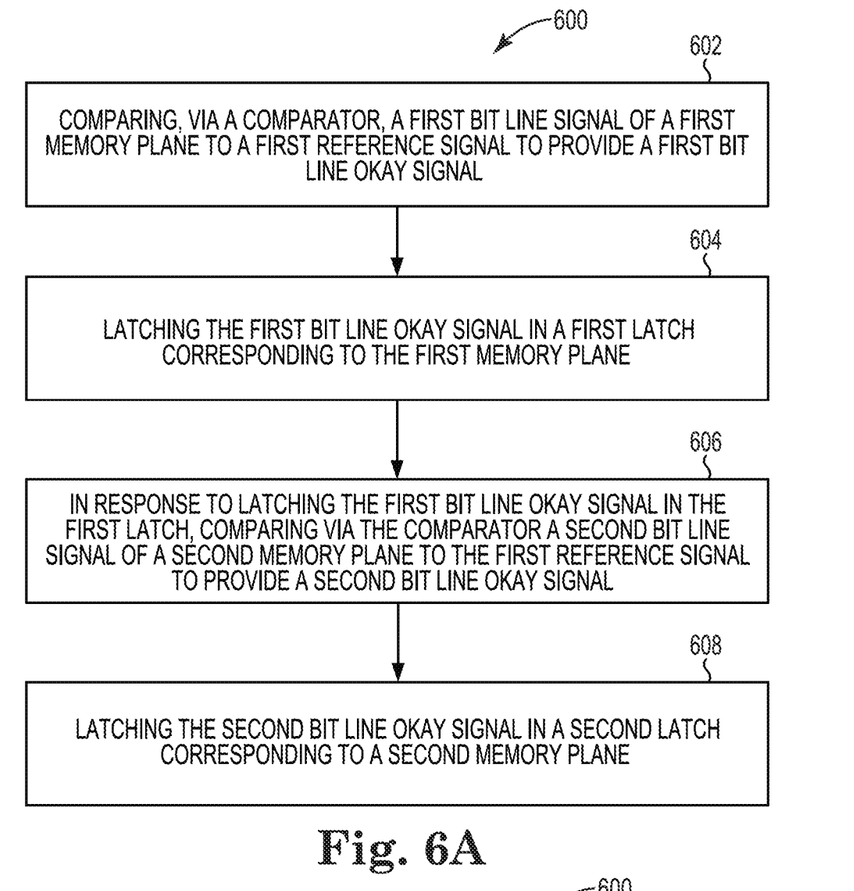
FIGS. 6A-6D are flow diagrams illustrating one embodiment of a method for comparing bit line signals to a reference signal.

FIGS. 6A-6D are flow diagrams illustrating one embodiment of a method 600 for comparing bit line signals to a reference signal. In one embodiment, method 600 may be implemented by the comparator circuit 400 previously described and illustrated with reference to FIG. 4. As illustrated in FIG. 6A, at 602 method 600 includes comparing, via a comparator, a first bit line signal of a first memory plane to a first reference signal to provide a first bit line okay signal. At 604, method 600 includes latching the first bit line okay signal in a first latch corresponding to the first memory plane. At 606, method 600 includes in response to latching the first bit line okay signal in the first latch, comparing via the comparator a second bit line signal of a second memory plane to the first reference signal to provide a second bit line okay signal. At 608, method 600 includes latching the second bit line okay signal in a second latch corresponding to a second memory plane.

Figure 6B:
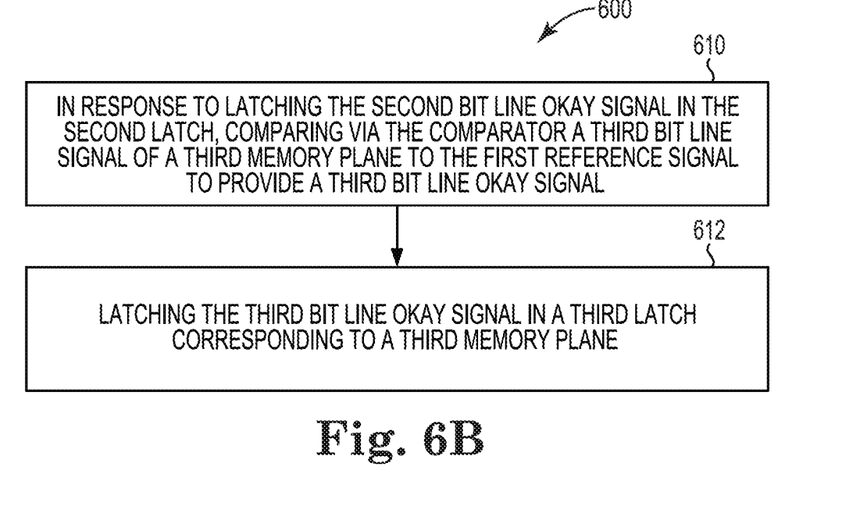
Figure 6C:
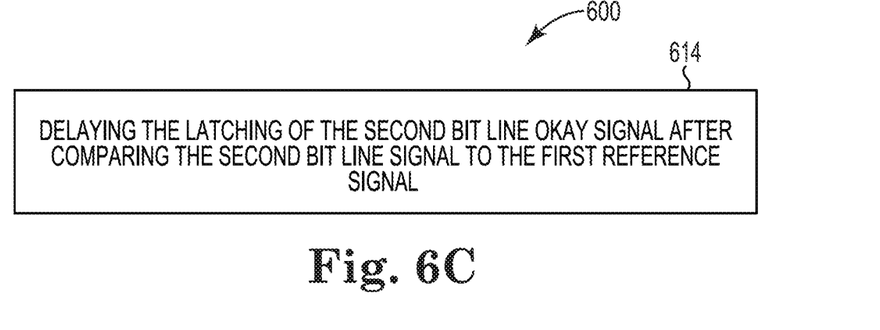

As illustrated in FIG. 6B, at 610 method 600 may further include in response to latching the second bit line okay signal in the second latch, comparing via the comparator a third bit line signal of a third memory plane to the first reference signal to provide a third bit line okay signal. At 612, method 600 may further include latching the third bit line okay signal in a third latch corresponding to a third memory plane. As illustrated in FIG. 6C, at 614 method 600 may further include delaying the latching of the second bit line okay signal after comparing the second bit line signal to the first reference signal.

Figure 6D:
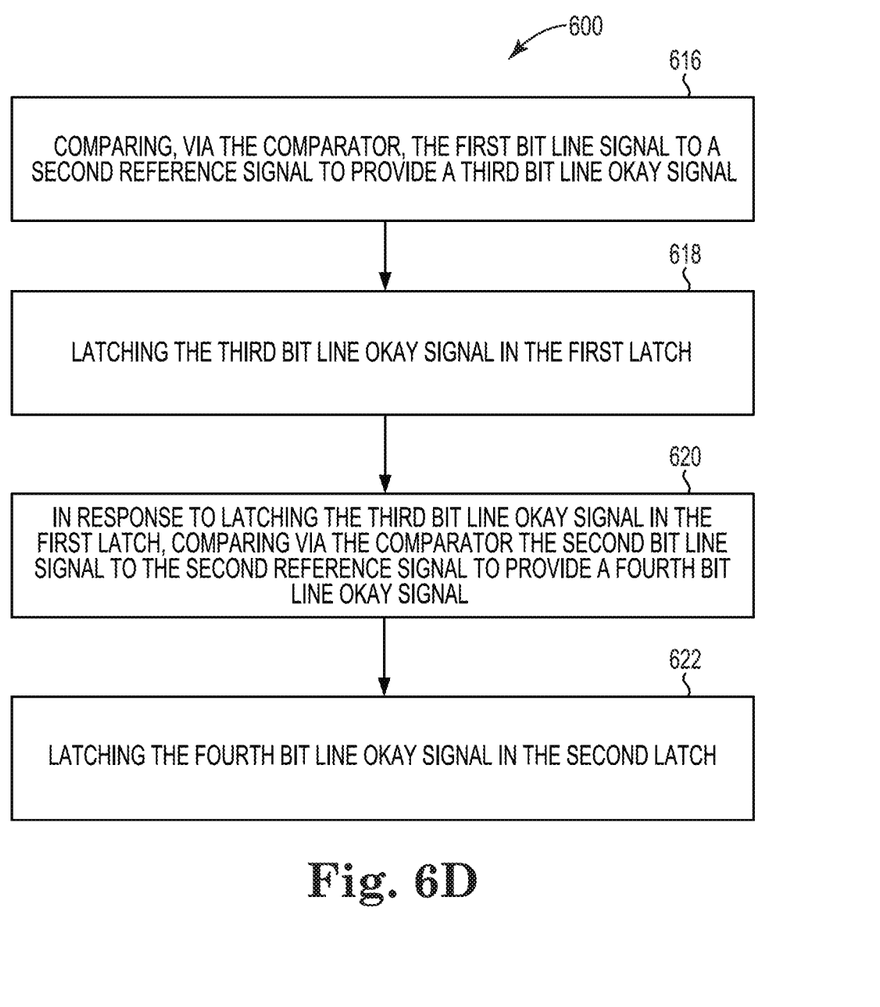

As illustrated in FIG. 6D, at 616 method 600 may further include comparing, via the comparator, the first bit line signal to a second reference signal to provide a third bit line okay signal. At 618, method 600 may further include latching the third bit line okay signal in the first latch. At 620, method 600 may further include in response to latching the third bit line okay signal in the first latch, comparing via the comparator the second bit line signal to the second reference signal to provide a fourth bit line okay signal. At 622, method 600 may further include and latching the fourth bit line okay signal in the second latch.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A device comprising:
a comparator;
a reference signal node electrically coupled to a first input of the comparator;
a plurality of test signal nodes;
a plurality of first select signal nodes, each first select signal node corresponding to a test signal node;
a first multiplexer coupled between the plurality of test signal nodes and the comparator, the first multiplexer to electrically couple one of the plurality of test signal nodes to a second input of the comparator in response to a corresponding first select signal on one of the plurality of first select signal nodes;
a plurality of latches, each latch corresponding to a test signal node;
a plurality of second select signal nodes, each second select signal node corresponding to a latch; and
a second multiplexer coupled between an output of the comparator and the plurality of latches, the second multiplexer to electrically couple the output of the comparator to an input of one of the plurality of latches in response to a corresponding second select signal on one of the plurality of second select signal nodes.

2. The device of claim 1, further comprising:
a plurality of delays, an input of each delay electrically coupled to a corresponding first select signal node and an output of each delay electrically coupled to a corresponding second select signal node.

3. The device of claim 2, wherein each delay comprises a resistive-capacitive delay.

4. The device of claim 2, further comprising: control logic to initiate a comparison of each test signal to a reference signal by setting an initial first select signal logic high and an initial second select signal logic high.

5. The device of claim 1, wherein the comparator comprises a differential comparator.

6. The device of claim 1, further comprising:
a plurality of reference signal nodes; and
a third multiplexer coupled between the plurality of reference signal nodes and the first input of the comparator, the third multiplexer to electrically couple one of the plurality of reference signals nodes to the first input of the comparator in response to a corresponding select reference signal.

7. The device of claim 6, further comprising:
control logic to initiate a comparison of each test signal to each reference signal by setting an initial first select signal logic high, an initial second select signal logic high, and an initial reference select signal logic high.

8. The device of claim 1, wherein each test signal node comprises a data line signal node of a memory plane.

9. The device of claim 1, wherein each test signal node comprises an access line signal node of a memory plane.

10. A system comprising:
a comparator;
a reference signal node electrically coupled to a first input of the comparator;
a plurality of memory planes, each memory plane including a data line node;
a plurality of select plane signal nodes, each select plane signal node corresponding to a memory plane;
a first multiplexer coupled between the plurality of data line nodes and the comparator, the first multiplexer to electrically couple one of the plurality of data line nodes to a second input of the comparator in response to a corresponding select plane signal on one of the plurality of select plane signal nodes;
a plurality of latches, each latch corresponding to a memory plane;
a plurality of open latch signal nodes, each open latch signal node corresponding to a latch; and
a second multiplexer coupled between an output of the comparator and the plurality of latches, the second multiplexer to electrically couple the output of the comparator to an input of one of the plurality of latches in response to a corresponding open latch signal on one of the plurality of open latch signal nodes.

11. The system of claim 10, further comprising:
a plurality of delays, an input of each delay electrically coupled to a corresponding select plane signal node and an output of each delay electrically coupled to a corresponding open latch signal node.

12. The system of claim 11, wherein each delay comprises a resistive-capacitive delay.

13. The system of claim 11, further comprising: control logic to initiate a comparison of each data line signal to the reference signal by setting an initial select plane signal logic high and an initial open latch signal logic high.

14. The system of claim 10, wherein the comparator comprises a differential comparator.

15. The system of claim 10, further comprising: a plurality of reference signal nodes; and a third multiplexer coupled between the plurality of reference signal nodes and the first input of the comparator, the third multiplexer to electrically couple one of the plurality of reference signal nodes to the first input of the comparator in response to a corresponding select reference signal.

16. The system of claim 15, further comprising: control logic to initiate a comparison of each data line signal to each reference signal by setting an initial select plane signal logic high, an initial open latch signal logic high, and an initial reference select signal logic high.

* * * * *